United States Patent [19]

Crisafulli

[11] 4,121,111
[45] Oct. 17, 1978

[54] APPARATUS FOR DETECTION OF SYNCHRONISM BY MEANS OF VECTOR DIFFERENCE MEASUREMENT

[75] Inventor: George A. Crisafulli, Hatfield, Pa.

[73] Assignee: Gould Inc., Rolling Meadows, Ill.

[21] Appl. No.: 733,440

[22] Filed: Oct. 18, 1976

[51] Int. Cl.² .............................................. H02J 3/00
[52] U.S. Cl. ........................................ 307/87; 361/89
[58] Field of Search ..................... 307/70, 87, 64, 85, 307/86, 87, 43, 57, 29, 23

[56] References Cited

U.S. PATENT DOCUMENTS 3,069,556  12/1962  Apfelbeck et al. .................... 307/87

Primary Examiner—Robert K. Schaefer
Assistant Examiner—Morris Ginsburg
Attorney, Agent, or Firm—Ostrolenk, Faber, Gerb & Soffen

[57] ABSTRACT

Solid stage apparatus for the detection of synchronism between line and bus voltages in order to permit safer interconnection therebetween is disclosed. A first comparator circuit constantly monitors the magnitude of the vector difference between the line voltage and the bus voltage and generates a first enabling signal whenever the magnitude of the vector difference voltage is below a predetermined value. The first enabling signal will continue to be generated until the magnitude of the vector difference voltage rises above the predetermined value. A second comparator circuit monitors the relative magnitudes of the line and bus voltages and generates a second enabling signal whenever a high bus-dead line or a dead bus-high line circuit occurs. The second enabling signal will continue to be generated as long as one of these conditions exist. The enabling signals are applied to a time delay circuit. If either enabling signal is applied to the time delay circuit for a predetermined time period, the time delay circuit will generate an output signal which enables a connection between the bus and line.

10 Claims, 7 Drawing Figures

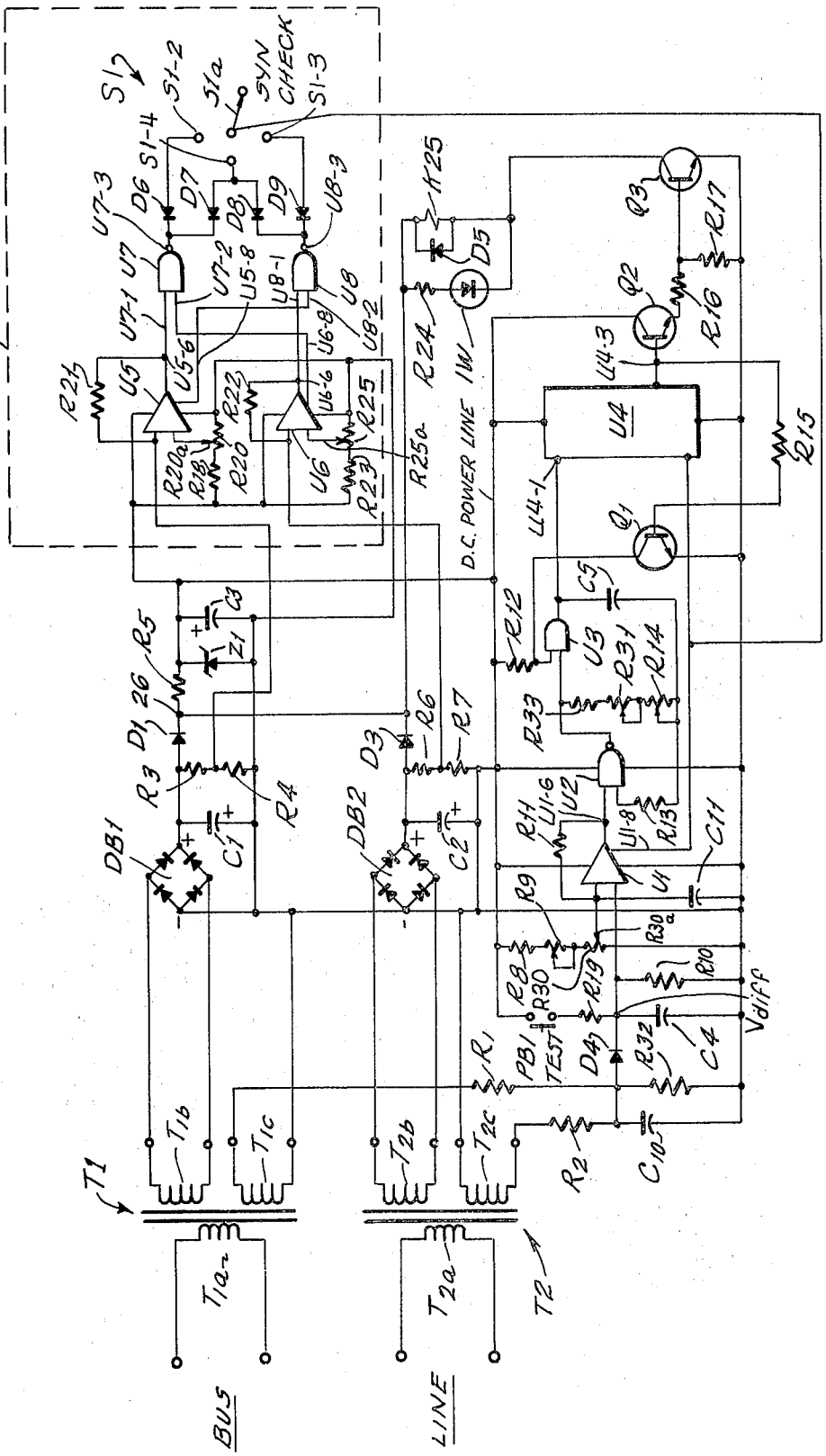

TYPICAL VOLTAGE DIFFERENCE CLOSING CHARACTERISTIC FOR A 120 VOLT 50/60 HZ RELAY WITH RATED VOLTAGE ON ONE CIRCUIT and line 12 inputs applied at 13 and 14 are divided into two

APPARATUS FOR DETECTION OF SYNCHRONISM BY MEANS OF VECTOR DIFFERENCE MEASUREMENT

BACKGROUND OF THE INVENTION

Whenever it is desired to close a breaker connecting two a.c. power systems, the system voltages must be in synchronism at the time of closing to prevent serious equipment damage to either of the systems or the breaker from abnormal power flow. To prevent a breaker from closing under unsynchronized conditions, a Synchronism Check Relay is used. In most cases the relay will not close the breaker directly but will close relay contacts which will permit an operator to close the breaker. Even at large slip frequencies the two voltages are in synchronism for short periods of time during each cycle of the slower frequency. As the slip frequency decreases the aforementioned time interval of synchronism increases. In order to be able to close the breaker at a desired slip frequency, a time delay is incorporated. Since the length of the time delay is a function of the frequency difference between the two signals, the longer the time delay, the closer to equal the frequencies must be before the two lines are closed (i.e. connected).

The term synchronism refers to the relationship between the magnitude and phase of each system. Two voltages are in synchronism when both their magnitudes and their phase angles are within preset limits.

BRIEF DESCRIPTION OF THE INVENTION

There is another situation or set of situations as it may be called, under which it is permissible to close a breaker connecting two a.c. systems and yet, have no abnormal power flow. This occurs when one system is at or near zero volts (dead) while the other system is close to rated voltage (high). The synchronism check relay of the present invention, in addition to its normal operation, will permit a close after the specified time delay if any of the following conditions exists and that condition has been selected through the function switch:

(1) High Bus-Dead Line,
(2) High Line-Dead Bus, or
(3) either High Bus-Dead Line or High Line-Dead Bus The apparatus of the present invention determines synchronism by measuring the magnitude of the vector difference voltage between two systems. FIG. 1 illustrates this concept where one system is at its rated voltage and the other is at a different magnitude and phase angle. It can be seen from FIG. 1 that if "in synchronism" is defined as the condition when the difference vector $V_{diff}$ between vectors $V_1$ and $V_2$ is below a fixed magnitude, then the permissible values of $V_2$ are the set of vectors whose points are with the circle whose center is at the head of $V_1$ and whose radius is equal to the magnitude of $V_{diff}$. These systems are then defined to be in synchronism. In the present invention, the magnitude of $V_{diff}$ is preselected and the relay will pick up if the head of $V_2$ enters the described circle C.

The relay of the invention, in addition to performing normal synchronism operations, is adapted to permit a close if any of the following conditions exists and if that function is selected: High Bus-Dead Line, High Line-Dead Bus, and either High Bus-Dead Line or High Line-Dead Bus.

In the prior art, electromechanical synchronism check relays were typically employed to determine synchronism. One prior art static relay, which, like the electromagnetic relays, determines synchronism by comparing two quantities of each system voltage: magnitude and phase angle. When each of these quantities are within specified limits, both types of prior art relays will pick up and begin the time delay. In addition, the electromechanical relays provide the High Bus-Dead Line and High Line-Dead Bus option but one of them has the "either or" capability of the present invention. The difference between the two synchronism detection methods lies entirely in the coverage area. In the previous method, as shown in FIG. 2, the relay will pick up if the magnitude of vector $V_2$ is between arcuate line segments M1 and M2 and the phase angle is between $-\theta$ and $+\theta$. This technique requires the measurement of two quantities and makes it impossible to set a maximum fixed magnitude of vector difference volts for any phase angle. This lack of control over the magnitude of voltage difference is important because it is this voltage which determines the power transfer at the instant of breaker closing. FIG. 3 illustrates the basic differences between the two systems. The shaded areas $A_1 - A_4$ represent undesirable closing areas that are inherent in the previous system that are not present in the "circle" characteristic of the present invention. Of course, the sector defined by $R_1$, $R_2$, $M_1$ and $M_2$ could be adjusted to be contained within the circle, but this would reduce the total area significantly and thus eliminate highly desirable closing area. In conclusion, the "circle" characteristic affords maximum control of the important parameters; magnitude of vector measured in volts.

OBJECTS AND BRIEF DESCRIPTION OF THE FIGURES OF THE INVENTION

It is therefore an object of the present invention to provide a solid state relay capable of interconnecting two lines when any one of a selective plurality of conditions persist for a predetermined time period.

A further object of the present invention is to provide a relay of the type described hereinabove wherein the particular conditions under which interconnection may take place may be selectively chosen by the operator.

The above as well as other objects of the present invention will become apparent when reading the accompanying description and drawings in which:

FIG. 5 shows a detailed schematic diagram of the static relay of FIG. 4.

DETAILED DESCRIPTION OF THE INVENTION

Figure 1:
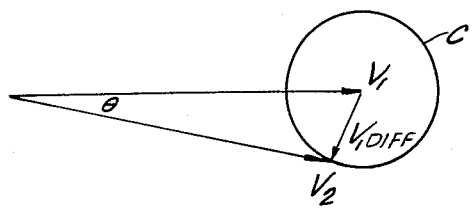
FIGS. 1, 2 and 3 show vector diagrams useful in describing the operating principles of the present invention.
Figure 2:
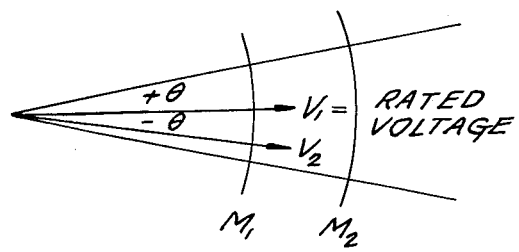
Figure 3:
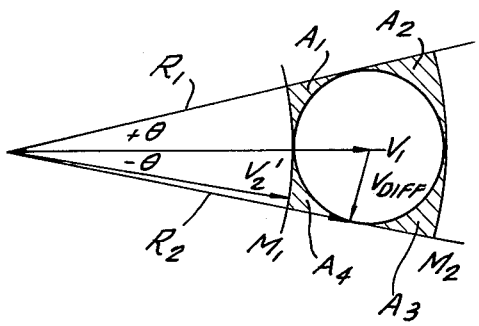
Figure 4:
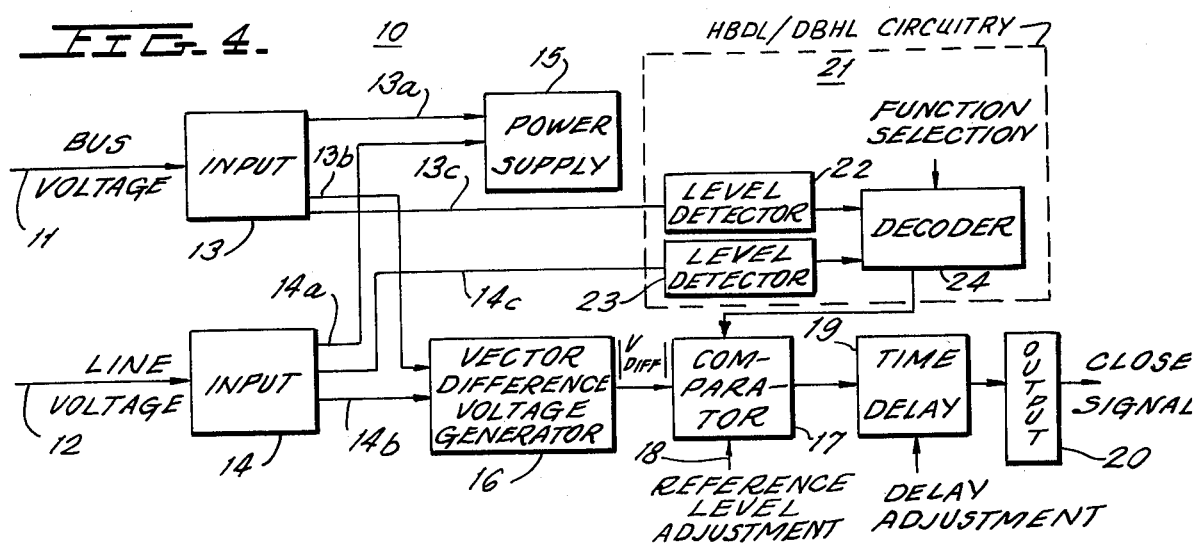
FIG. 4 is a block diagram of a static relay embodying the principles of the present invention.

The two single phase sinusoidal voltages to be synchronized are called "bus" and "line" respectively. An input is provided for each. The block diagram of the detection circuit 10 is shown in FIG. 4. The bus 11 and line 12 inputs applied at 13 and 14 are divided into two components, one each (13a and 14a) to feed the power supply 15 and one each (13b and 14b) to feed the vector difference voltage generator circuit 16. The d.c. signal representing the magnitude of $V_{diff}$ is compared at 17 with a set reference level 18. If $V_{diff}$ is below the reference level the time delay period will be initiated by application of a signal level (a time delay initialing signal) to time delay circuit 19. If $V_{diff}$ remains below the reference level for a time period which is longer than that set by the delay adjustment, circuit 19 will time out and the output at 20 will close relay contacts thus generating the permit-to-close signal. The HBDL/DBHL circuitry 21 consists of two level detectors 22 and 23 (which determine the state of the bus and line from the outputs 13c and 14c), and a decoder 24. If the condition existing at the inputs corresponds to the function selected, decoder 24 enables the comparator circuit 17 so that the comparator circuit 17 generates the time delay initiating signal thereby enabling time delay circuit 19. In summary, time delay circuit will enable the bus and line to be connected if either the magnitude of the vector difference voltage remains below the predetermined value for a predetermined time period or one of the high bus-dead line or dead bus-high line conditions monitored by HBDL/DBHL circuitry 21 occur for the predetermined time period.

INPUT CIRCUITS

Considering the detailed circuitry of FIG. 5, the bus and line inputs 13 and 14 are connected to the primaries T1a and T2a of transformers T1 and T2 respectively. Each secondary has two windings, one (T1b and T2c) to supply d.c. power for the circuit and one (T1c and T2c) for difference voltage generation.

VECTOR DIFFERENCE VOLTAGE GENERATION

Figure 5A:
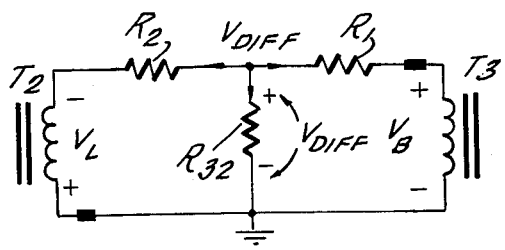
FIG. 5a shows a portion of the circuitry of FIG. 5 which is useful in describing the different determining circuits.

The vector difference voltage generation circuit is redrawn as shown in FIG. 5a. The filtering capacitor C10 has been omitted in this figure. The voltage across resistor R32 can be found from the node equation:

$$\frac{V_{diff} - V_L}{R_2} + \frac{V_{diff}}{R_{32}} + \frac{V_{diff} - (-V_B)}{R_1} = 0 \quad (1)$$

assuming $R_2 = R_{32} = R_1 = R$, then equation (1) may be reduced as follows:

$$V_{diff} - V_L + V_{diff} + V_{diff} + V_B = 0 \quad (2)$$
$$3 V_{diff} - V_L + V_B = 0 \quad (3)$$
$$3 V_{diff} = V_L - V_B \quad (4)$$
$$V_{diff} = \frac{V_L - V_B}{3} \quad (5)$$

Therefore, the voltage across R32 is directly proportional to ⅓ of the difference between the line voltage $V_L$ and the bus voltage $V_B$. This a.c. voltage is rectified by diode D4 and filtered by capacitor C4 and resistor R10. The d.c. voltage across C4 is proportional to the difference voltage.

COMPARATOR CIRCUIT

The difference voltage $V_{diff}$ is fed to the comparator circuit 17 which comprises an operational amplifier U1 which is connected (by resistor R11) to operate as a comparator, and the resistance reference network R8, R9 and R30. Comparator U1 will generate a time delay initiating signal at its output U1-6 whenever the vector difference voltage $V_{diff}$ is less than a preset voltage or whenever an enabling signal is applied to its input U1-S. The desired preset voltage is set by adjusting arm R30a (which is protected from transient voltages by capacitor C11) of potentiometer 30. The enabling signal applied to input U1-8 of comparator U1 is generated by HBDL/DBHL circuit 21 in a manner to be described below. When either the difference voltage $V_{diff}$ is less than the preset value or the enabling signal is applied to input U1-8, the output U1-6 of comparator U1 from increases zero volts to 6.8 volts (the time delay initiating signal) and time delay circuit is enabled. A test pushbutton switch PB1 is also provided.

TIME DELAY CIRCUIT

The time delay circuit includes a variable frequency clock and a pulse counter. When pick-up occurs, the clock is started and its output is fed into a pulse counter. When the count in the pulse counter reaches a predetermined value (e.g., 64), drive is delivered to the output circuit and the relay is energized. The clock is constructed from two NAND gates U2 and U3 and an RC timing circuit whose main components are capacitor C5 resistors R13, R14, R33 and potentiometer R31. If the frequency of the clock is increased (by adjusting potentiometer R31), the time required for the counter to reach 64 counts decreases and hence the time delay is decreased and vice versa. The pulses developed by the clock are applied to input U4-1 of a binary counter U4, which develops an output signal at U4-3 whenever the predetermined count (64 in the above example) is reached.

OUTPUT CIRCUIT

The output relay K25 is energize when drive is supplied to transistor Q3. This occurs at the end of the time delay period determined by the time delay circuit. Particularly, when the time delay circuit times out and counter U4 generates an output signal at U4-3, transsistor Q2 turns on, supplying power to the base of transistor Q3 via the voltage divider R16, R17. The power supplied to the base of transistor Q3 turns transistor Q3 on thereby permitting current to flow through relay 25. A diode D5 is connected in parallel with relay 25 to protect relay 25 from any reverse currents which might otherwise flow through relay 25 via the series connected resistor R24 and diode 1W. A transistor Q1 is also provided to disable the timer circuit after the counter U4 counts out. Particularly, when counter U4 generates an output signal on line U4-3, transistor Q1 is energized (via resistor R15) to shunt current from the d.c. power supply (otherwise supplied to U3 and C5), to ground potential thereby disabling the variable frequency clock.

POWER CIRCUIT

Power is derived from the input signal or signals of lines 11 and 12. The multi-turn secondaries T1b and T2b each supply their own diode bridge and filter capacitor (DB1C1 and DB2-C2) which establish independent power supplies preferably 48 volts d.c.) for relay coil power. The appropriate reference voltage for the electronics is established by connecting a zener diode Z1 of the proper rating to the 48 volt supply through resistor R5. Diodes D1 and D3 assure that the highest d.c. output level will appear terminal 26 and, together with bridges DB1 and DB2, prevent the d.c. signals from being fed back to the a.c. lines.

HBDL/DBHL CIRCUIT

The HBDL/DBHL circuit 21 includes of two level detectors U5 and U6 and a decoding circuit comprising logic gates U7 and U8 and diodes D6–D9. Level detectors U5, U6 are operational amplifiers connected (via feedback resistors R21, R22, respectively) to operate as comparators. Voltage levels at which the bus and line are considered dead (and at which the detectors U5, U6 generate output signals) can be adjusted through potentiometers R20 and R25 respectively. For example, if the bus voltage level, as impressed across resistor R4, is higher than the dead level set at the arm R20a of potentiometer R20, then output U5-6 of U5 will be high (e.g., 8.2 volts) and output U5-8 of U5 will be low (e.g., 0 volts). If the line voltage, as developed across R7, is lower than the dead voltage level set at arm R25a, then output U6-6 of U6 will be low and output U6-8 of U6 will be high. This corresponds to the High Bus-Dead Line condition. The following voltages will then appear at inputs U7-1, U7-2, U8-1 and U8-2, respectively, of logic gates U7, U8: $+V^{DC}$, $+V^{DC}$, 0, 0. The two high voltages at inputs U7-1 and U7-2 will cause the output of NAND gate U7 to go low (i.e., to go to 0 volts D.C.).

If the arm S12 of function switch S1 is in the S1-2 position (HBDL), then input U1-8 of comparator U1 will be pulled to ground (the enabling signal) through diode D6 and output U7-3 of NAND gate U7, causing a high voltage to appear at output U1-6 of U1 which starts the clock and initiate the time delay. This is the desired result. If switch arm S1a were in position S1-4 (HBDL or HLDB), the same result would occur with diode D7 replacing (i.e. performing the function of) D6. The arm S1a would not, however, be grounded through diode D8 because the two zero voltages at the inputs of NAND gate U8 will drive the output of U8 high ($+V^{DC}$ volts), reverse biasing diode D8.

Figure 6:
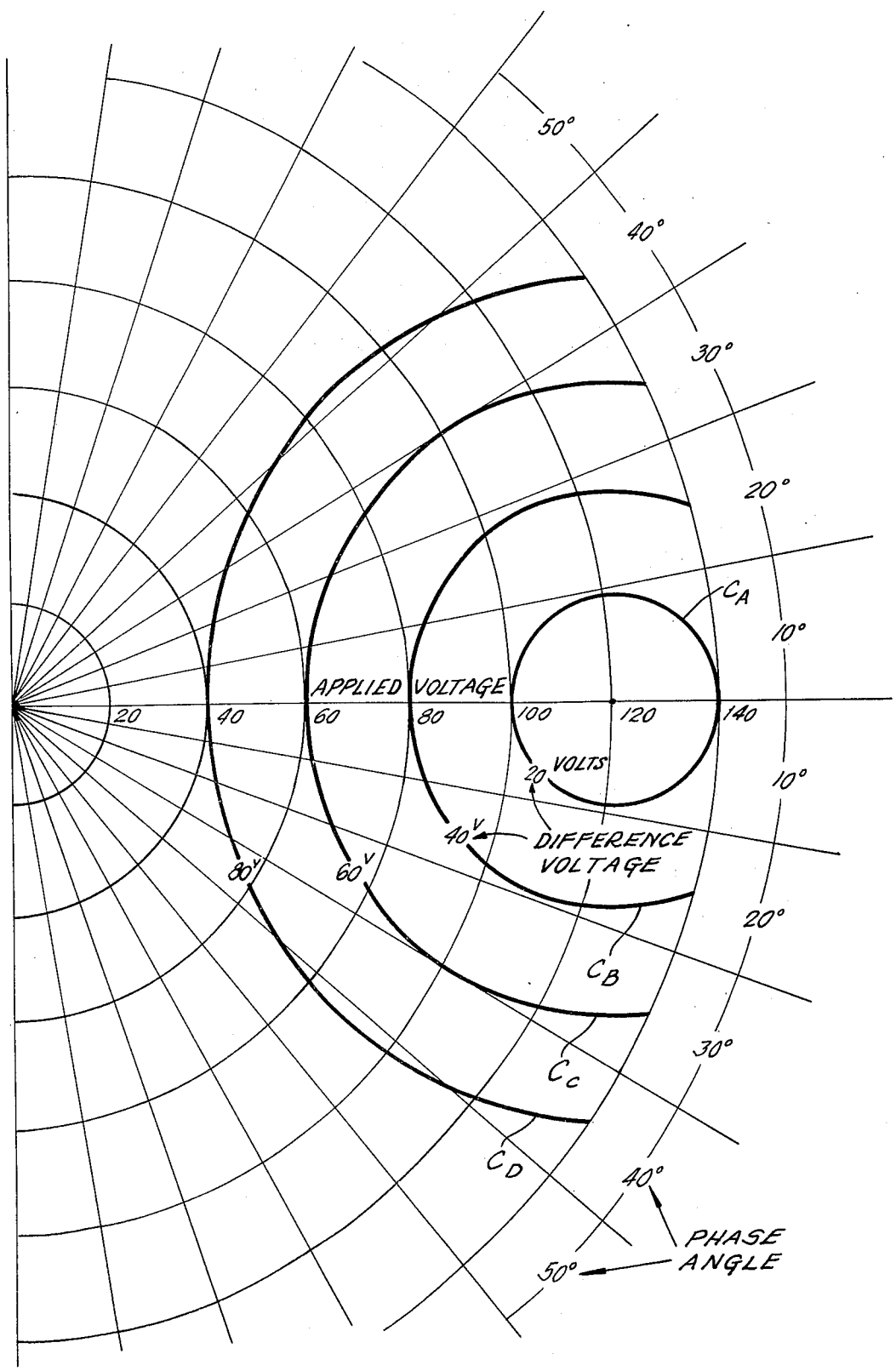
FIG. 6 shows a plot of a typical voltage difference closing characteristic in which one of the circuits to be interconnected is at rated voltage.

Finally, if S1a is in position S1-3 (HLDB), diode D9 will be reverse biased since output U8-3 of U8 will be at $+V^{DC}$ volts. As a result, input U1-8 of U1 will not be grounded and the time delay will not be initiated. This is also the desired result since HLDB is chosen and HBDL exists. A similar result can be shown to occur for the HLDB condition. FIG. 6 shows the results obtained for a particular application, i.e. one in which the line voltage is 120 volts 50/60 HZ. Circle $C_A$, for example, contains all points of a signal having no greater than a 20 volt difference relative to line voltage. Similar plots are shown for voltage differences of 40 volts ($C_B$), 60 volts ($C_C$) and 80 volts ($C_D$).

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. Apparatus for detecting the relative synchronism between a first and a second a.c. signal occurring on first and second lines, respectively, said apparatus comprising:
    (A) first means for generating a vector difference signal representing the magnitude of the vector difference between said first and said second a.c. signals;
    (B) second means for monitoring the instantaneous magnitudes of said first and second a.c. signals and for determining when first and second conditions exist:
        (1) said first condition being defined as that condition wherein said first a.c. signal has an instantaneous magnitude which is greater than a first predetermined value and said second a.c. signal has an instantaneous magnitude which is less than a second predetermined value;
        (2) said second condition being defined as that condition wherein said first a.c. signal has an instantaneous value which is less than said first predetermined value and said second a.c. signal has an instantaneous value greater than said second predetermined value;
    (c) switch means responsive to said second means and selectively operable in first, second and third states, said switch means to generate an enabling signal:
        (1) when said first condition exists and said switch means is in said first state;
        (2) when said second condition exists and said switch means is in said second state;
        (3) when either said first or said second conditions exist and said switch means is in said third state;
    (D) third means for enabling a desired interconnection between said first and said second lines if either said vector difference signal is less than a predetermined value for a predetermined time period or said switch means generates said enabling signal for said predetermined time period.

2. The apparatus of claim 1 wherein said third means comprises:
    (A) comparator means responsive to said vector difference signal and said enabling signal for generating a time delay initiating signal whenever the magnitude of said vector difference is less than a preset value or said switch means is generating said enabling signal;
    (B) time delay means responsive to said time delay initiating signal for generating an output signal if said time delay initiating signal is generated for said predetermined time period;
    (C) means responsive to said output signal for enabling said desired interconnection between said first and second lines when said time delay means generates said output signal.

3. The apparatus of claim 1 further including:
    (A) first signal converting means for converting said first a.c. signal into a first d.c. signal;
    (B) second signal converting means for converting said second a.c. signal into a second d.c. signal;
    (C) means for combining said first and second d.c. signals and for utilizing the combined d.c. signal as a power source for said first, second and third means.

4. The apparatus of claim 1 wherein said switch means comprises a mechanical switch operable in first, second and third positions corresponding to said first, second and third states, respectively.

5. The apparatus of claim 2 wherein said time delay means comprises:
    adjustable frequency pulse generating means responsive to said time-delay initiating signal for generating a train of pulses having an adjustable frequency whenever said time delay initiating signal is applied thereto; and
    counter means responsive to said train of pulses for generating said output signal whenever said pulse generating means has generated a predetermined number of pulses.

6. The apparatus of claim 5 further comprising means responsive to said output signal for disabling said pulse generating means.

7. The apparatus of claim 3 wherein said first and second signal converting means include a first and second transformer means, respectively, the primaries of each of said first and second transformer means being coupled to said first and second lines, respectively, the secondaries of said first and second transformer means being coupled to first and second uni-directional conducting means, respectively.

8. The apparatus of claim 7 wherein each of said uni-directional conducting means comprises a diode bridge.

9. The apparatus of claim 7 wherein said first means comprises:

(A) a vector addition circuit for vectorially adding the voltage across said secondary windings of said first and second transformer means, respectively, and for generating an a.c. output signal representative of the magnitude of the vector difference between said first and second a.c. signals;

(B) uni-directional current means for converting said a.c. signal representative of said vector difference into a a.c. signal.

10. The apparatus of claim 9 wherein said vector addition circuit comprises a T-network including a common first impedance element, a second impedance element connecting one terminal of said secondary winding of said first transformer means to said common impedance element, a third impedance element connecting one terminal of said secondary winding of said second transformer means to said common impedance element whereby said a.c. signal representing said difference voltage is represented by the voltage drop across said common impedance element.

* * * * *